US010460946B2

(12) United States Patent
Lin et al.

(10) Patent No.: US 10,460,946 B2
(45) Date of Patent: Oct. 29, 2019

(54) NATURALLY OXIDIZED FILM REMOVING METHOD AND NATURALLY OXIDIZED FILM REMOVING DEVICE

(71) Applicants: TOKYO ELECTRON LIMITED, Tokyo (JP); CENTRAL GLASS CO., LTD., Ube-shi, Yamaguchi (JP)

(72) Inventors: Jun Lin, Nirasaki (JP); Koji Takeya, Nirasaki (JP); Shinichi Kawaguchi, Nirasaki (JP); Mitsuhiro Tachibana, Nirasaki (JP); Akifumi Yao, Ube (JP); Kunihiro Yamauchi, Ube (JP)

(73) Assignees: TOKYO ELECTRON LIMITED, Tokyo (JP); CENTRAL GLASS CO., LTD., Yamaguchi (JP)

( * ) Notice: Subject to any disclaimer, the term of this patent is extended or adjusted under 35 U.S.C. 154(b) by 0 days.

(21) Appl. No.: 15/744,401

(22) PCT Filed: Jun. 7, 2016

(86) PCT No.: PCT/JP2016/066885
§ 371 (c)(1),
(2) Date: Jan. 12, 2018

(87) PCT Pub. No.: WO2017/010194
PCT Pub. Date: Jan. 19, 2017

(65) Prior Publication Data
US 2018/0211844 A1    Jul. 26, 2018

(30) Foreign Application Priority Data

Jul. 15, 2015 (JP) .................................. 2015-140914

(51) Int. Cl.
*H01L 21/302* (2006.01)
*H01L 21/02* (2006.01)
(Continued)

(52) U.S. Cl.
CPC ........ *H01L 21/302* (2013.01); *H01L 21/0237* (2013.01); *H01L 21/02046* (2013.01);
(Continued)

(58) Field of Classification Search
CPC ............... H01L 21/302; H01L 21/0237; H01L 21/3065; H01L 21/304; H01L 21/02046;
(Continued)

(56) References Cited

U.S. PATENT DOCUMENTS

2010/0099264 A1* 4/2010 Elers .................. H01L 21/31122
438/710
2017/0365478 A1* 12/2017 George .................... C23F 1/12

FOREIGN PATENT DOCUMENTS

JP    2519625 B2    5/1996
JP    2008-103431 A    5/2008
JP    5043835 B2    7/2012

OTHER PUBLICATIONS

International Search Report dated Jul. 5, 2016 in corresponding International Application No. PCT/JP2016/066885.

* cited by examiner

*Primary Examiner* — Nadine G Norton
*Assistant Examiner* — Mahmoud Dahimene
(74) *Attorney, Agent, or Firm* — Nath, Goldberg & Meyer; Jerald L. Meyer

(57) ABSTRACT

A technique capable of removing a natural oxide film formed on a surface of a semiconductor layer which contains a compound of indium and an element other than indium as a main ingredient, without making a temperature of the semiconductor layer relatively high. The technique includes supplying a first etching gas which is β-diketone to the semiconductor layer and heating the semiconductor layer to remove an oxide of the indium constituting the natural oxide film; and supplying a second etching gas to the semicon-
(Continued)

ductor layer and heating the semiconductor layer to remove an oxide of the element constituting the natural oxide film. By using the first etching gas, it is possible to remove the indium oxide even if the temperature of the semiconductor layer is relatively low. This eliminates the need to increase the temperature to a relatively high level when removing the natural oxide film.

8 Claims, 14 Drawing Sheets

(51) Int. Cl.
  *H01L 21/67* (2006.01)
  *H01L 21/687* (2006.01)
(52) U.S. Cl.
  CPC .. *H01L 21/02049* (2013.01); *H01L 21/67103* (2013.01); *H01L 21/68742* (2013.01)
(58) Field of Classification Search
  CPC ......... H01L 21/02049; H01L 21/68742; H01L 21/67103
  See application file for complete search history.

FIG. 13
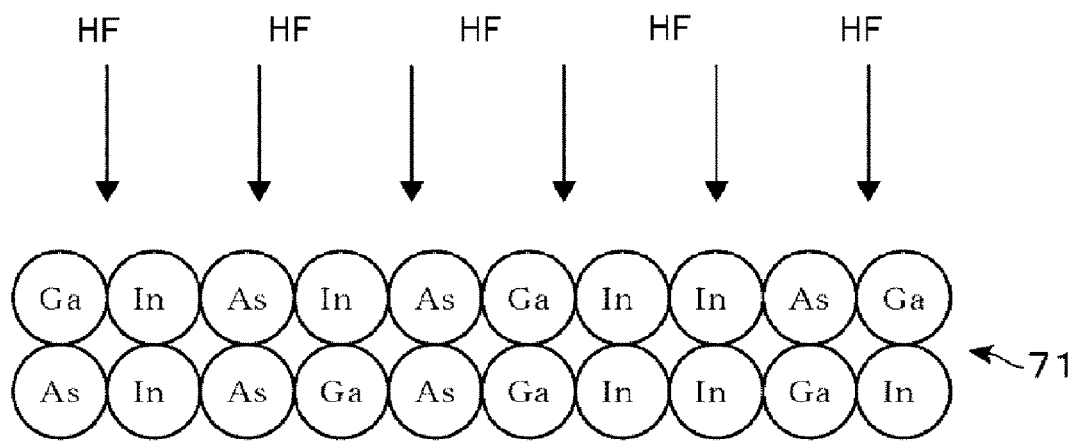
FIG. 14
FIG. 15
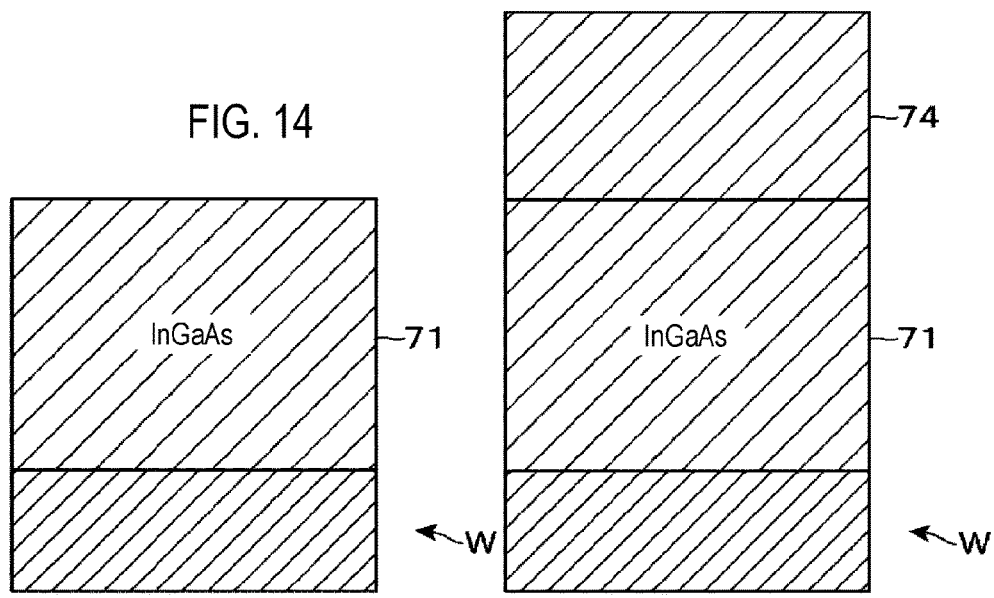

Evaluation test 1-1

Evaluation test 1-2

Evaluation test 1-3

Evaluation test 1-4

Evaluation test 1-5

NATURALLY OXIDIZED FILM REMOVING METHOD AND NATURALLY OXIDIZED FILM REMOVING DEVICE

TECHNICAL FIELD

The present disclosure relates to a method of removing a natural oxide film formed on a semiconductor layer containing a compound of indium and an element other than indium and a device for removing a natural oxide film.

BACKGROUND

Silicon (Si) is used for a channel of a transistor included in a semiconductor device. In such a configuration in which Si is used, the mobility of carriers cannot be sufficiently increased. Thus, the current flowing through the channel cannot be sufficiently large. As such, the performance of the semiconductor device in which Si is used for the channel is physically limited. To address the above problem, studies were made showing that the performance of the semiconductor device is significantly improved by increasing the current flowing through the channel with a material having a higher carrier mobility than Si, for example, such as indium gallium arsenide (InGaAs), instead of Si.

In order to manufacture a transistor including InGaAs, an InGaAs layer is formed on a semiconductor wafer (hereinafter, referred to as a "wafer") as a substrate, and subsequently, a high dielectric constant insulating film called a high-k film is laminated by, for example, chemical vapor deposition (CVD). However, there is a case where a natural oxide film is formed on the surface of the InGaAs layer before the formation of the high-k film. If such a natural oxide film is formed at an interface between the high-k film and the InGaAs layer, the interface state density becomes high. This makes it difficult to increase the current of the channel as described above, which degrades the performance of the transistor.

Patent Document 1 describes the removal of arsenic oxide in a resist film using hydrogen fluoride. Patent Document 2 describes that a conductor layer constituting a light emitting diode is made of gallium oxide and the conductor layer may be chemically etched with hydrogen chloride. In this regard, it is considered that the natural oxide film of the InGaAs layer is removed using, for example, a hydrogen chloride gas or a hydrogen fluoride gas as an etching gas. However, in order to remove oxide of indium (In) constituting the natural oxide film of the InGaAs layer using the hydrogen chloride gas or the hydrogen fluoride gas as mentioned above, a compound ($InF_3$) containing indium (In) and fluorine or a compound ($GaF_3$) containing indium (In) and chlorine should be generated and these compounds should be sublimated. In order to generate such compounds, it is necessary to heat the wafer at a relatively high temperature. For example, the generation of $InF_3$ requires heating the wafer at a temperature of 900 degrees C. or higher, and the generation of $GaF_3$ requires heating the wafer at a temperature of 500 degrees C. or higher. At such high temperatures, however, there is a possibility that the wirings of the semiconductor device formed on the wafer may be damaged and the heat resistance limit of a device that performs the removal process of the natural oxide film may be exceeded.

Therefore, it becomes necessary to perform a wet etching process to remove the natural oxide film. In such a wet etching process, the natural oxide film may not be sufficiently removed. Moreover, there is a possibility that the surface of the InGaAs layer may be reoxidized when the wafer processed by the device that performs the wet etching process is carried into a process vessel which is kept in a vacuum atmosphere to form the high-k film.

In addition, Patent Document 3 discloses that indium adhered as a contaminant onto the surface of a substrate used for manufacturing a semiconductor device is removed by supplying oxygen and hexafluoroacetylacetone. However, Patent Document 3 does not describe the removal of a natural oxide film of metal constituting the semiconductor. Therefore, the problem of how to remove the natural oxide film in the semiconductor layer cannot easily be solved by those skilled in the art based on Patent Document 3 mentioned above.

PRIOR ART DOCUMENTS

Patent Documents

Patent Document 1: Japanese laid-open publication No. 2008-103431 (paragraph 0077)

Patent Document 2: Japanese patent No. 5043835 (paragraphs 0010 and 0017)

Patent Document 3: Japanese patent No. 2519625 (paragraph 0041)

SUMMARY

The present disclosure provides some embodiments of a technique capable of removing a natural oxide film formed on a surface of a semiconductor layer which contains a compound of indium and an element other than indium as a main ingredient, without making a temperature of the semiconductor layer relatively high.

According to one embodiment of the present disclosure, there is provided a method of removing a natural oxide film formed on a surface of a semiconductor layer containing a compound of indium and an element other than indium as a main ingredient, including: supplying a first etching gas which is β-diketone to the semiconductor layer and heating the semiconductor layer to remove an oxide of the indium constituting the natural oxide film; and supplying a second etching gas to the semiconductor layer and heating the semiconductor layer to remove an oxide of the element other than indium constituting the natural oxide film.

According to another embodiment of the present disclosure, there is provided a device of removing a natural oxide film formed on a surface of a semiconductor layer containing a compound of indium and an element other than indium as a main ingredient, including: a mounting part installed inside a process vessel and configured to mount the semiconductor layer thereon; a heating part configured to heat the semiconductor layer mounted on the mounting part; a first etching gas supply part configured to supply a first etching gas which is β-diketone to the semiconductor layer to remove an oxide of the indium constituting the natural oxide film; and a second etching gas supply part configured to supply a second etching gas to the semiconductor layer to remove an oxide of the element other than indium constituting the natural oxide film.

According to the present disclosure, it is possible to remove an indium oxide constituting a natural oxide film on a surface of a semiconductor layer by using an etching gas composed of β-diketone, even if a temperature of the semiconductor layer made of a compound of indium and an element other than indium is relatively low. Thus, it is possible to remove the natural oxide film formed on the surface of the semiconductor layer while suppressing the temperature of the semiconductor layer at a low level.

BRIEF DESCRIPTION OF DRAWINGS

FIG. 13 is a schematic diagram illustrating a change in a surface of a semiconductor layer formed on the wafer.

FIG. 14 is a longitudinal sectional view of the wafer which has been processed by the etching device.

FIG. 15 is a longitudinal sectional view of the wafer which has been processed by the etching device.

DETAILED DESCRIPTION

Figure 1:
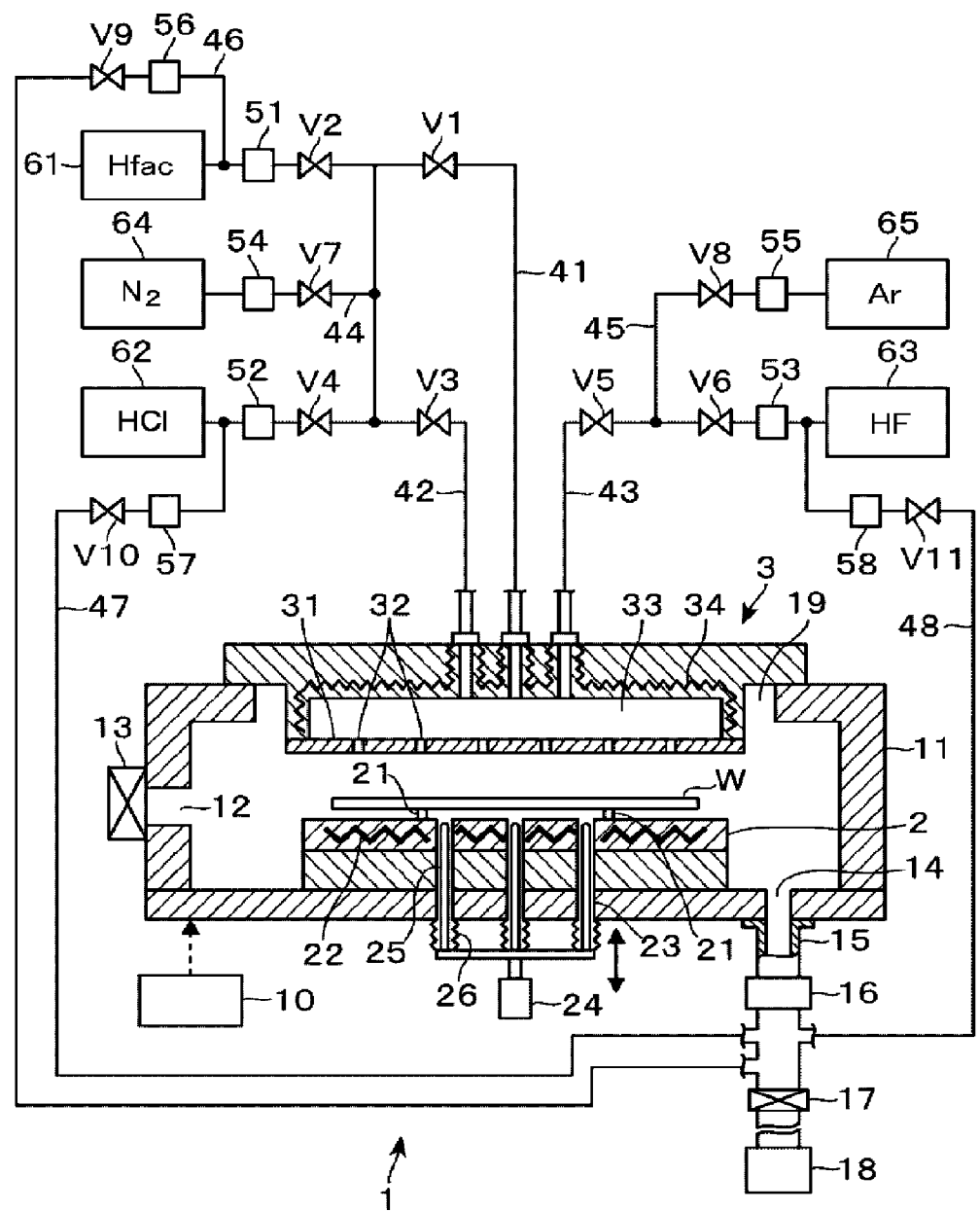
FIG. 1 is a longitudinal sectional view of an etching device according to one embodiment of the present disclosure.

An etching device 1 which is an example of a natural oxide film removing device of the present disclosure will be described with reference to FIG. 1. The etching device 1 includes a process vessel 11 which is a vacuum chamber having a substantially circular cross section. In FIG. 1, reference numeral 12 denotes a loading/unloading port which is opened in a lateral side of the process vessel 11 to transfer a wafer W therethrough. The loading/unloading port 12 is opened and closed by a gate valve 13. In addition, a heater (not shown) for heating an inner surface of the process vessel 11 to a predetermined temperature is installed in the process vessel 11.

A cylindrical stage 2 as a mounting part of the wafer W is installed inside the process vessel 11. In FIG. 1, reference numeral 21 denotes support pins for supporting the wafer W mounted on the stage 2. The support pins 21 are installed at multiple locations on an upper surface of the stage 2 so as to support the wafer W while floating by, for example, 0.3 mm from the upper surface of the stage 22. A heater 22 serving as a heating part is installed inside the stage 2. The wafer W mounted on the stage 2 is heated to have a set temperature.

In FIG. 1, reference numeral 23 denotes through holes that penetrate the stage 2 and a bottom surface of the process vessel 11. Protrusion pins 25 used to transfer the wafer W therethrough are installed in the through holes 23 so as to move up and down in the upper surface of the stage 2 by an elevating mechanism 24. In FIG. 1, reference numeral 26 denotes a bellows which covers lower sides of the protrusion pins 25 and ensures airtightness within the process vessel 11.

In FIG. 1, reference numeral 14 denotes an exhaust port opened in the bottom surface of the process vessel 11. The exhaust port 14 is connected to an exhaust pipe 15. The other end of the exhaust pipe 15 is connected to a vacuum pump 18 used as a vacuum exhaust mechanism through a pressure regulating valve 16 and an opening/closing valve 17 in this order.

A circular gas supply part 3 is installed to close an opening portion 19 formed in an upper surface of the process vessel 11. In FIG. 1, reference numeral 31 denotes a circular dispersion plate constituting the gas supply part 3, which faces the wafer W mounted on the stage 2. In FIG. 1, reference numeral 32 denotes gas supply holes that penetrate the dispersion plate 31 in a thickness direction. The dispersion plate 31 is configured as a punching plate in which the gas supply holes 32 are arranged lengthwise and widthwise. A dispersion chamber 33 configured to disperse a gas supplied to the wafer W within the gas supply part 3 is located above the dispersion plate 31. In FIG. 1, reference numeral 34 denotes a heater for heating the gas supply part 3.

In FIG. 1, reference numerals 41, 42 and 43 denote gas supply pipes whose downstream ends are opened toward the dispersion chamber 33. An upstream end of the gas supply pipe 41 is connected to a supply source 61 of a hexafluoroacetylacetone (Hfac) gas which is β-diketone through valves V1 and V2 and a flow rate adjusting part 51 in this order. An upstream end of the gas supply pipe 42 is connected to a supply source 62 of a hydrogen chloride (HCl) gas through valves V3 and V4 and a flow rate adjusting part 52 in this order. An upstream end of the gas supply pipe 43 is connected to a supply source 63 of a hydrogen fluoride (HF) gas through valves V5 and V6 and a flow rate adjusting part 53 in this order. The Hfac gas supply source 61 constitutes a first etching gas supply part, and the HCl gas supply source 62 and the HF gas supply source 63 constitute a second etching gas supply part.

In FIG. 1, reference numeral 64 denotes a supply source of a nitrogen ($N_2$) gas, to which an upstream end of the gas supply pipe 44 is connected. A flow rate adjusting part 54 and a valve V7 are sequentially installed in the gas supply pipe 44 toward a downstream side of the gas supply pipe 44. The downstream end of the gas supply pipe 44 is branched into two paths, one of which is connected between the valves V1 and V2 of the gas supply pipe 41 and the other of which is connected between and the valves V3 and V4 of the gas supply pipe 42. In FIG. 1, reference numeral 65 denotes a supply source of an argon (Ar) gas, to which an upstream end of the gas supply pipe 45 is connected. A flow rate adjusting part 55 and a valve V8 are sequentially installed in the gas supply pipe 45 toward a downstream side of the gas supply pipe 45. The downstream end of the gas supply pipe 45 is connected between the valves V5 and V6 of the gas supply pipe 43. The Hfac gas, the HCl gas and the HF gas are etching gases for removing a natural oxide film, which will be described later. The $N_2$ gas is a dilution gas for diluting the Hfac gas and the HCl gas. The Ar gas is a dilution gas for diluting the HF gas.

An upstream end of a bypass pipe 46 is connected between the Hfac gas supply source 61 and the flow rate adjusting part 51 installed in the gas supply pipe 41. A downstream end of the bypass pipe 46 is connected between the pressure regulating valve 16 and the opening/closing valve 17 installed in the exhaust pipe 15 through a flow rate adjusting part 56 and a valve V9 in this order. An upstream end of a bypass pipe 47 is connected between the HCl gas supply source 62 and the flow rate adjusting part 52 installed in the gas supply pipe 42. A downstream end of the bypass pipe 47 is connected between the pressure regulating valve 16 and the opening/closing valve 17 installed in the exhaust pipe 15 through a flow rate adjusting part 57 and a valve V10 in this order. An upstream end of a bypass pipe 48 is connected between the HF gas supply source 63 and the flow rate adjusting part 53 installed in the gas supply pipe 43. A downstream end of the bypass pipe 48 is connected between the pressure regulating valve 16 and the opening/closing valve 17 installed in the exhaust pipe 15 through a flow rate adjusting part 58 and a valve V11 in this order. The bypass pipes 46 to 48 are pipes for stabilizing the flow rate of each gas when supplying each etching gas into the process vessel 11 by supplying each etching gas to the exhaust pipe 15 when each etching gas is not supplied into the process vessel 11, during a natural oxide film removal process which will be described later, The etching device 1 further includes a control part 10. The control part 10 is configured as, for example, a computer, and includes a program, a memory, and a CPU. The program incorporates a group of steps so as to execute a series of operations in the operation description as described hereinbelow. According to the program, the temperature adjusting operation of the wafer W, the opening/closing operation of each of the valves V1 to V11, the flow rate adjusting operation of each gas, and the internal pressure regulating operation of the process vessel 11 and the like are performed. This program is stored in a computer storage medium, for example, a compact disc, a hard disk, a magneto-optical disc, a memory card or the like, and installed in the control part 10.

Figure 2:
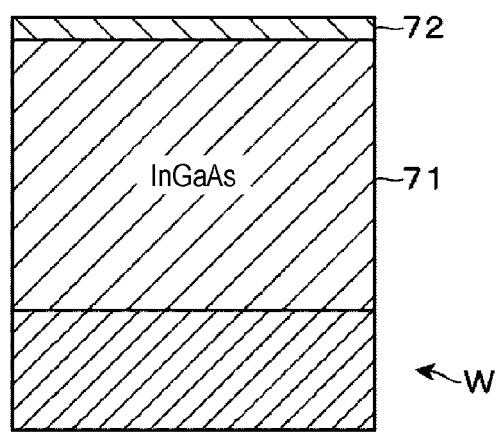
FIG. 2 is a longitudinal sectional view of a wafer processed by the etching device.

Next, a wafer W carried into the etching device 1 will be described with reference to a longitudinal sectional view of FIG. 2. An InGaAs layer 71 which is a semiconductor layer is formed on a surface of the wafer W. The InGaAs layer 71 constitutes a channel of a transistor, for example, as described in the Background section of the present disclosure. A surface (upper surface) of the InGaAs layer 71 is naturally oxidized to form a natural oxide film 72. A state in which the wafer W illustrated in FIG. 2 is etched by the etching device 1 will be described with reference to FIGS. 3 to 6 each of which illustrates the operation of the etching device 1. In each pipe shown in FIGS. 3 to 6, a portion where a gas flows is indicated by a thicker line than a portion where the flow of a gas is stopped. An etching process will be appropriately described with reference also to FIGS. 7 to 13 which schematically illustrate each atom constituting the InGaAs layer 71 and each molecule of indium oxide, gallium oxide and arsenic oxide constituting the natural oxide film 72. In the following descriptions, the indium oxide, the gallium oxide, and the arsenic oxide may also be expressed as $InO_X$, $GaO_X$, and $AsO_X$, respectively.

Figure 3:
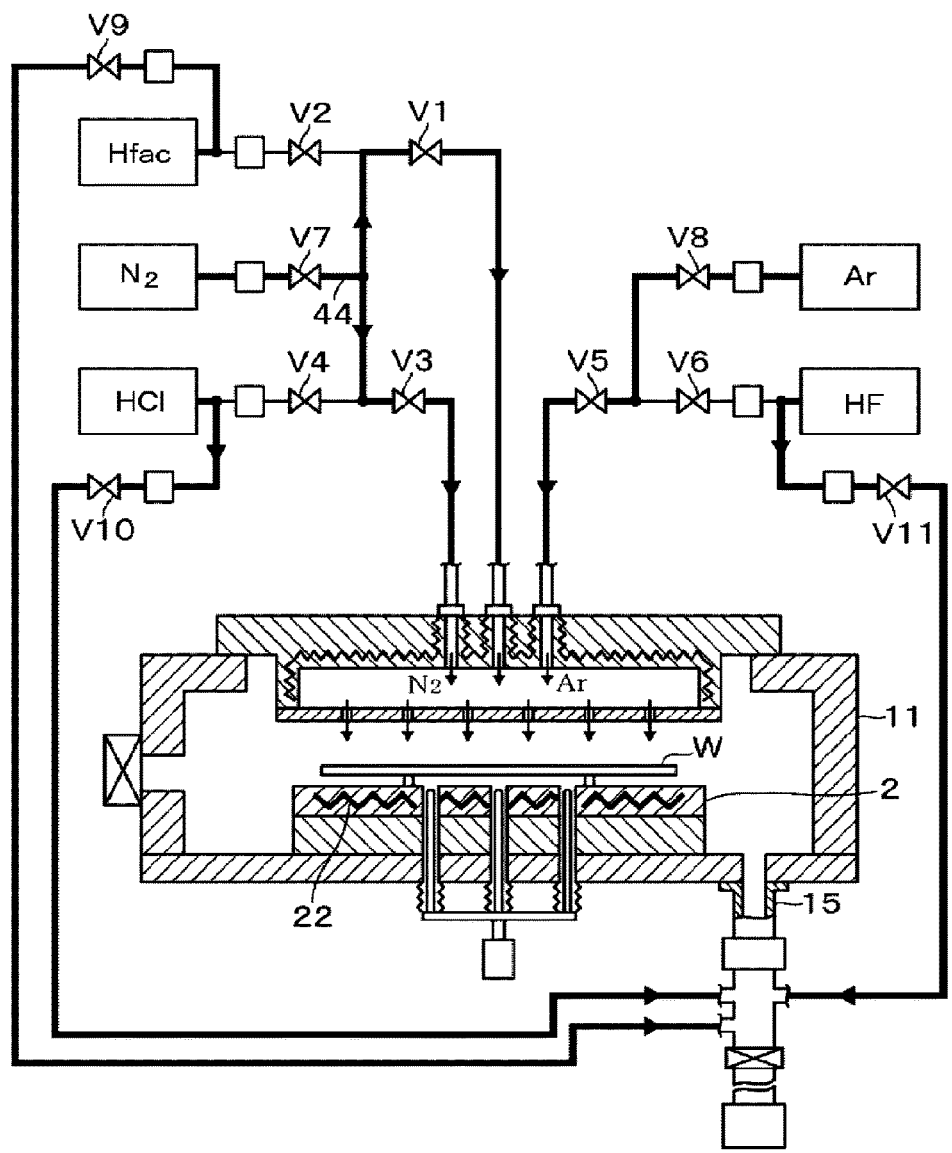
FIG. 3 is a longitudinal sectional view of the etching device.
Figure 4:
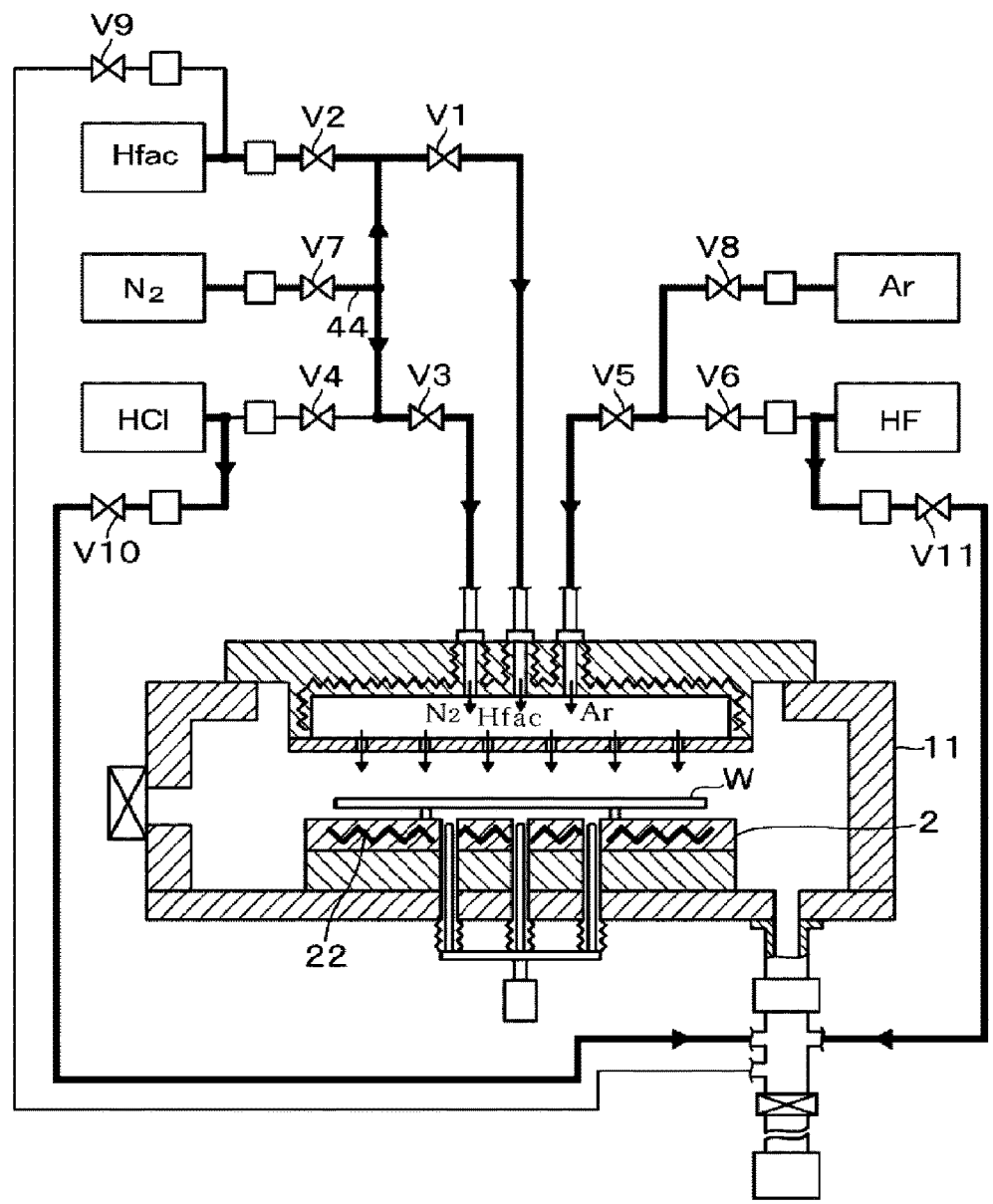
FIG. 4 is a longitudinal sectional view of the etching device.
Figure 7:
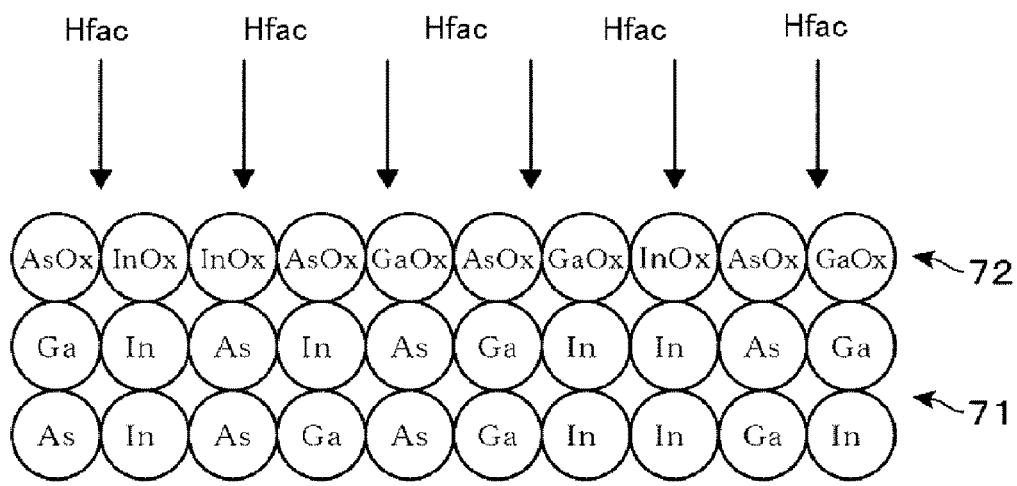
FIG. 7 is a schematic diagram illustrating a change in a surface of a semiconductor layer formed on the wafer.
Figure 8:
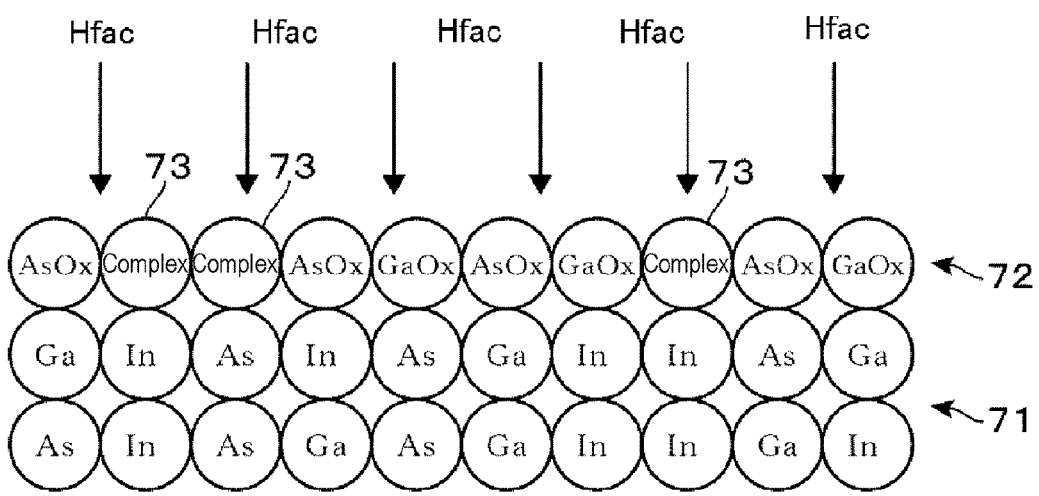
FIG. 8 is a schematic diagram illustrating a change in a surface of a semiconductor layer formed on the wafer.
Figure 9:
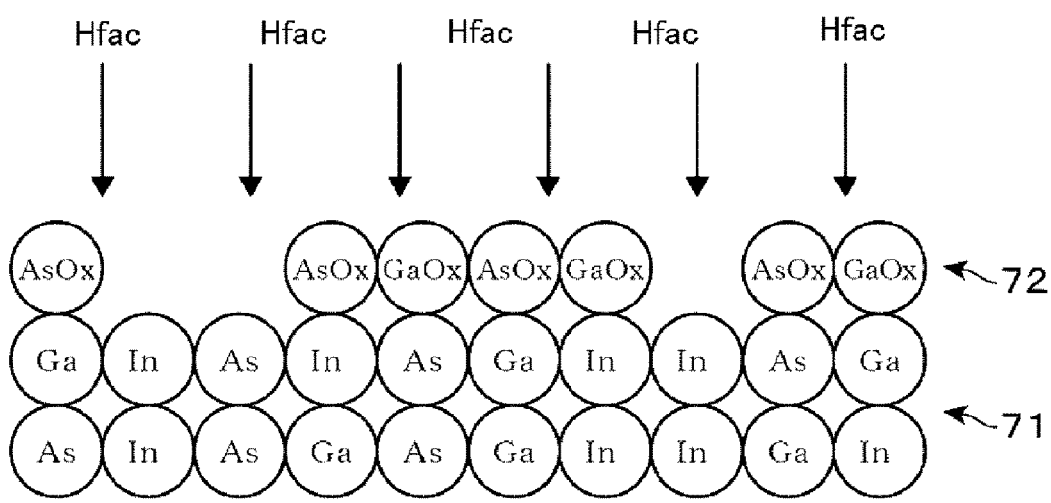
FIG. 9 is a schematic diagram illustrating a change in a surface of a semiconductor layer formed on the wafer.

First, the wafer W is mounted on the stage 2 and heated to a temperature lower than a decomposition temperature (about 375 degrees C.) of, for example, Hfac, for example, a predetermined temperature which falls within a range of 250 to 300 degrees C., by the heater 22. Then, the process vessel 11 is exhausted so that the process vessel 11 is kept in a vacuum atmosphere. The valves V1, V3, V5, V7 and V8 are opened to supply an $N_2$ gas and an Ar gas to the process vessel 11. In parallel with the supply of the $N_2$ gas and the Ar gas, the valves V9 to V11 are opened to supply an Hfac gas, an HCl gas and an HF gas to the exhaust pipe 15. FIG. 3 illustrates a state in which each gas is supplied in this manner. The valve V9 is closed and the valve V2 is opened in a state in which the interior of the process vessel 11 is set at a predetermined degree of vacuum, for example, 50 Torr ($6.67 \times 10^3$ Pa) by the exhaust, so that the Hfac gas is supplied to the process vessel 11 as illustrated in FIGS. 4 and 7. The Hfac gas reacts with $InO_X$ to form a complex 73 containing In (see FIG. 8). This complex 73 is sublimated by allowing the wafer W to be heated at the above temperature so that the complex 73 is removed from the surface of the InGaAs layer 71 (see FIG. 9). The removal of $InO_X$ is selectively performed. That is to say, $AsO_X$ and $GaO_X$ do not react with the Hfac gas but remain on the surface of the InGaAs layer 71.

Figure 5:
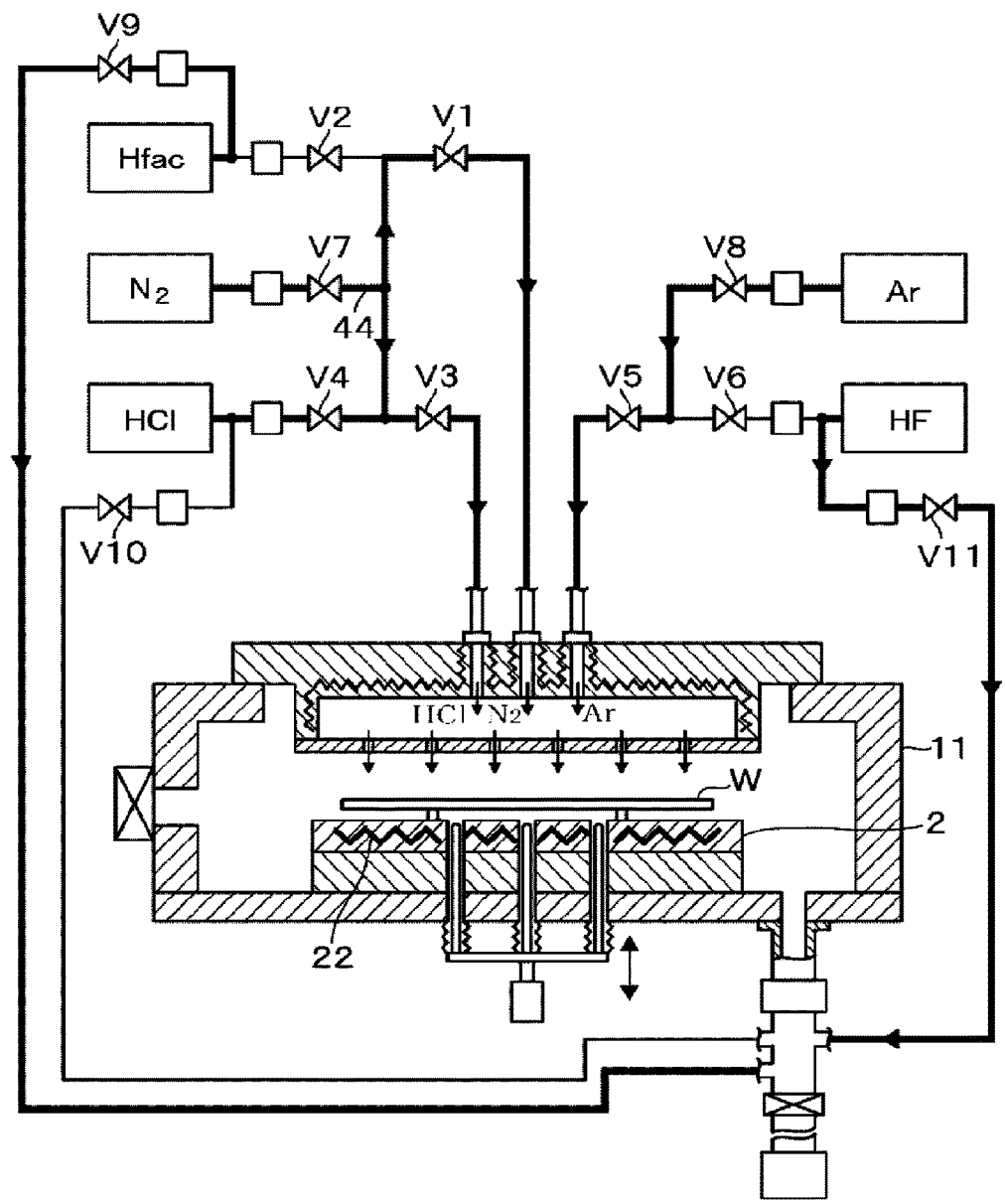
FIG. 5 is a longitudinal sectional view of the etching device.
Figure 10:
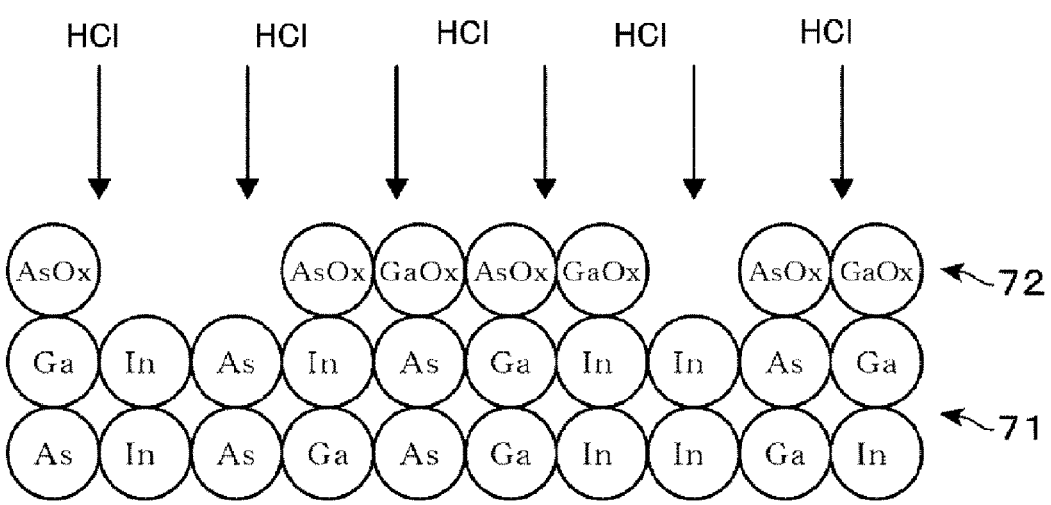
FIG. 10 is a schematic diagram illustrating a change in a surface of a semiconductor layer formed on the wafer.
Figure 11:
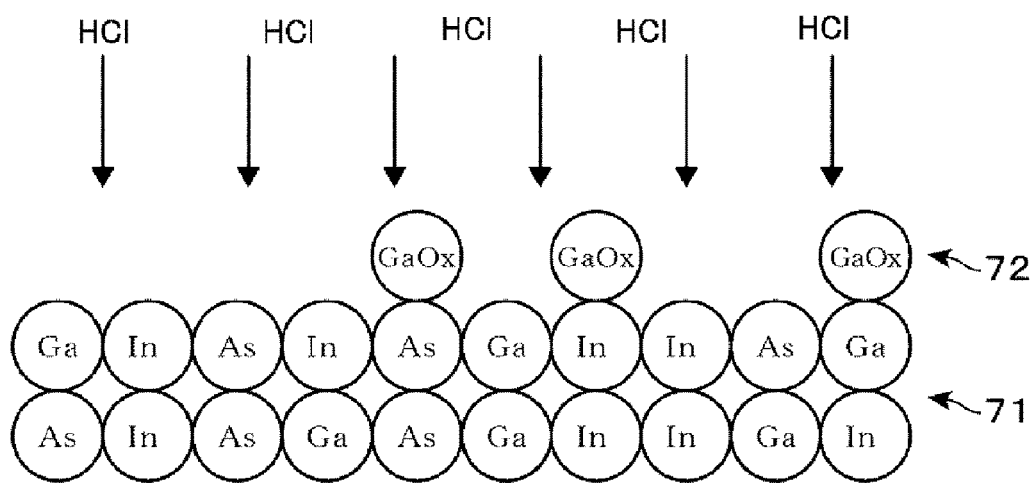
FIG. 11 is a schematic diagram illustrating a change in a surface of a semiconductor layer formed on the wafer.

Thereafter, the valve V2 is closed and the valve V9 is opened to stop the supply of the Hfac gas to the process vessel 11. Each gas is supplied to the process vessel 11 and the exhaust pipe 15 as illustrated in FIG. 3. The Hfac gas remaining in the process vessel 11 is purged and removed with the $N_2$ gas and the Ar gas supplied to the process vessel 11. At the same time, the temperature of the wafer W is set at, for example, 50 to 300 degrees C. Thereafter, the valve V10 is closed and the valve V4 is opened to supply the HCl gas to the process vessel 11 as illustrated in FIGS. 5 and 10. $AsO_X$ is etched by the HCl gas and removed from the surface of the InGaAs layer 71 (see FIG. 11). The HCl gas selectively reacts with $AsO_X$ to remove the $AsO_X$. That is to say, $GaO_X$ remains on the surface of the InGaAs layer 71.

Figure 6:
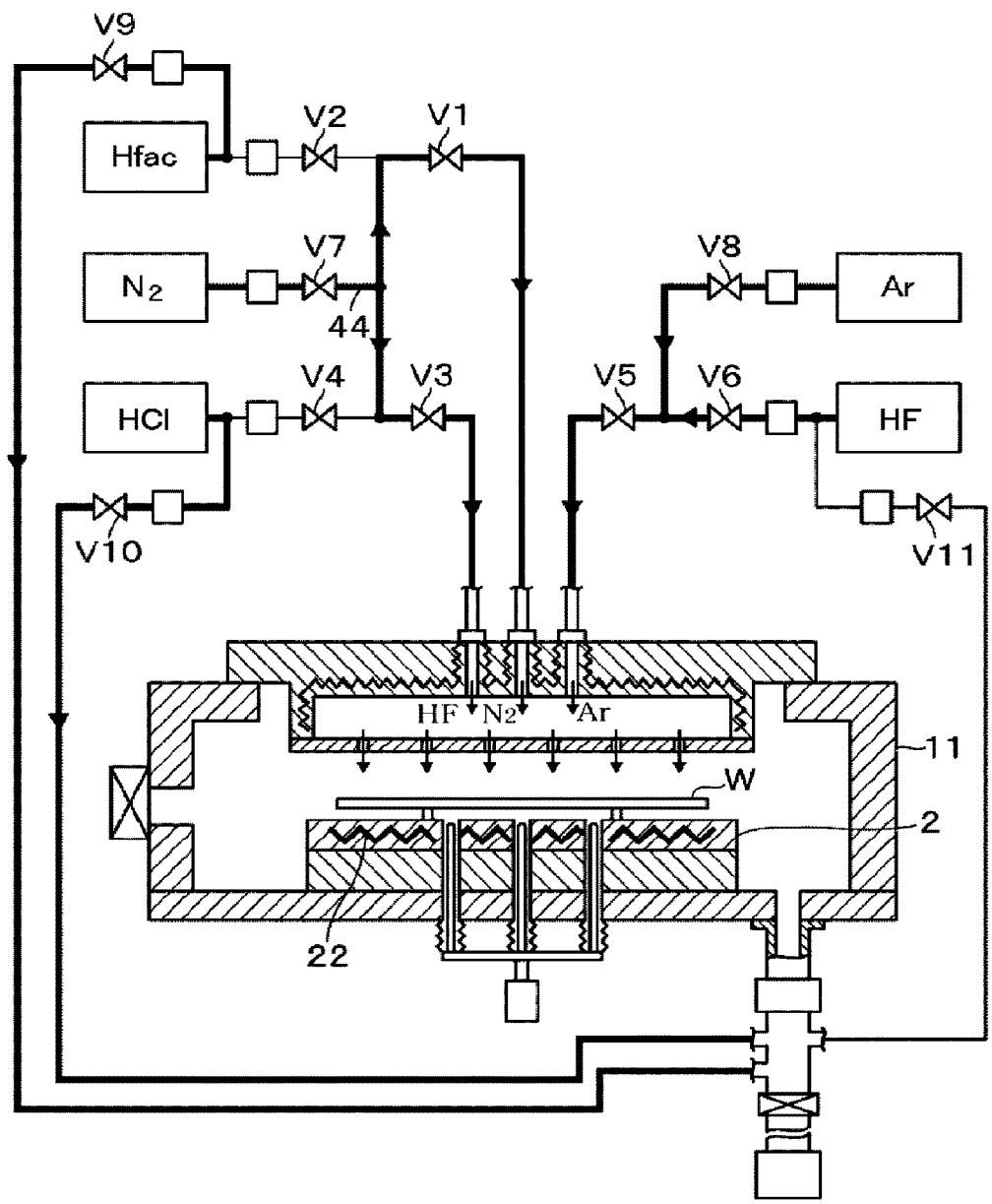
FIG. 6 is a longitudinal sectional view of the etching device.
Figure 12:
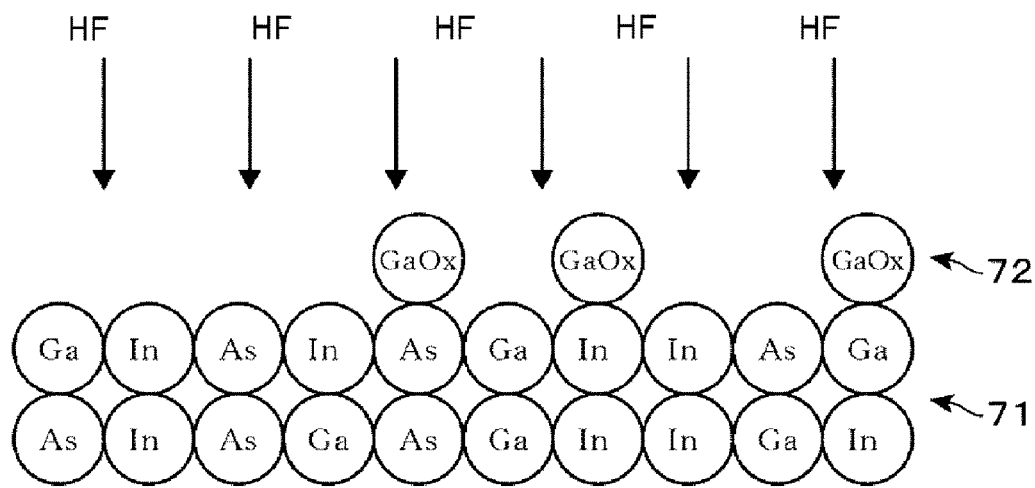
FIG. 12 is a schematic diagram illustrating a change in a surface of a semiconductor layer formed on the wafer.

Subsequently, the valve V4 is closed and the valve V10 is opened to stop the supply of the HCl gas to the process vessel 11. Each gas is supplied to the process vessel 11 and the exhaust pipe 15 as illustrated in FIG. 3. At the same time, the temperature of the wafer W is set at, for example, 25 to 150 degrees C. Thereafter, the valve V11 is closed and the valve V6 is opened to supply the HF gas to the process vessel 11 as illustrated in FIGS. 6 and 12. $GaO_X$ is etched by the HF gas and removed from the surface of the InGaAs layer 71 (see FIG. 13).

Thereafter, the valve V6 is closed and the valve V11 is opened to stop the supply of the HF gas to the process vessel 11. Each gas is supplied to the process vessel 11 and the exhaust pipe 15 as illustrated in FIG. 3. The HF gas remaining in the process vessel 11 is purged and removed by the $N_2$ gas and the Ar gas supplied to the process vessel 11, and the removal process of the natural oxide film 72 is completed. FIG. 14 illustrates the InGaAs layer 71 when the removal process of the natural oxide film 72 is completed. Thereafter, the wafer W is unloaded from the process vessel 11. The outside of the process vessel 11 is, for example, in a vacuum atmosphere. The wafer W is transferred in the vacuum atmosphere so as not to cause reoxidation of the surface of the InGaAs layer 71, and is carried into a film forming apparatus that performs CVD. Then, as illustrated in FIG. 15, the high-k film 74 described in the Background section of the present disclosure is laminated on the InGaAs layer 71.

In the aforementioned etching device 1, as for $InO_X$, $GaO_X$, and $AsO_X$ constituting the natural oxide film 72 of the InGaAs layer 71 which is the semiconductor layer, the Hfac gas is used to remove $InO_X$, the HCl gas is used to remove $GaO_X$, and the HF gas is used to remove $AsO_X$. By using the Hfac gas to remove $InO_X$ as describe above, it is possible to remove $InO_X$ in a state in which the wafer W is set to have a relatively low temperature. Thus, it is possible to suppress the damage to the wafer W by heat and to suppress the heat resistance required for the etching device 1 to a low level, in removing the natural oxide film 72.

It is possible for the Hfac gas, the HF gas, and the HCl gas to selectively remove $InO_X$, $AsO_X$, and $GaO_X$ respectively at a temperature lower than the temperature at which the Hfac gas is decomposed. In this regard, although all of $InO_X$, $GaO_X$, and $AsO_X$ have been described to be removed in the aforementioned process example, the process may be performed so that one of $GaO_X$ and $AsO_X$ remains on the InGaAs layer 71 by supplying only one of the HCl gas and the HF gas to the wafer W. Such a process is also included in the scope of the present disclosure. That is to say, a case where the process is performed so that each oxide is removed from indium and another element other than indium which are the main ingredient of the semiconductor layer, is also included in the scope of the present disclosure. Furthermore, the Hfac gas, the HCl gas, and the HF gas are not limited to being supplied to the wafer W in the named order, and may be supplied in any order. As an example, the HF gas, the HCl gas, and the Hfac gas may be supplied to the wafer W in this order. Further, the removal of $GaO_X$, the removal of $AsO_X$, and the removal of $InO_X$ may be performed in this order. In the case where the process is performed in the above-described order, the temperature of the wafer W is set at a first temperature when the HF gas is supplied, the temperature of the wafer W is set at a second temperature when the HCl gas is supplied, and the temperature of the wafer W is set at a third temperature when the Hfac gas is supplied. In addition, for example, the level of the temperature is set to satisfy the following relation: first temperature<second temperature<third temperature. By controlling the temperature in this manner, it is difficult for HCl and HF to react with $InO_X$ on the surface of the wafer at a relatively low temperature. It is therefore possible to more reliably suppress unnecessary compounds from being generated on the surface of the wafer W. In some embodiments, the first temperature and the second temperature may also be the same.

In the processes described with reference to FIGS. 3 to 13, the Hfac gas, the HCl gas, and the HF gas are supplied at different times, but they may be simultaneously supplied to the wafer W to remove the natural oxide film 72. However, by supplying the respective gases at different times, the process conditions of the wafer W when the respective gases are supplied may be suitably set. Specifically, the temperatures of the wafer W when the respective gases are supplied may be different from each other, or the internal pressures of the process vessel 11 when the respective gases are supplied may be different from each other. By suitably setting the process conditions as described above, it is possible to more reliably remove the natural oxide film 72.

There has been described an example in which the semiconductor layer is InGaAs. However, any compound may be used as the semiconductor layer as long as a compound of indium and an element other than indium is included as a main ingredient. Therefore, indium gallium (InGa), indium arsenide (InAs), indium antimony (InSb), or the like may be used as the semiconductor layer. In order to remove an oxide of antimony, for example, an HCl gas is used as an etching gas.

As described above, the reason that $InO_X$ can be removed at a relatively low temperature with the Hfac gas is because it is possible to form a complex containing indium whose sublimation temperature is lower than that of $InO_X$. Even in the case of using a gas which is β-diketone other than Hfac (also referred to as 1,1,1,5,5,5-hexafluoro-2,4-pentanedione), it is also possible to form a complex having a sublimation temperature lower than that of $InO_X$. Specifically, it is considered that such a complex can also be formed with a gas such as trifluoroacetylacetone (also referred to as 1,1,1-trifluoro-2,4-pentanedione), acetylacetone or the like. These gases may be used as an etching gas of $InO_X$ instead of the Hfac gas.

(Evaluation Tests)
Evaluation Test 1

Evaluation tests conducted in relation to the present disclosure will be described. Different processes were performed on a plurality of wafers W described with reference to FIG. 2. In evaluation test 1-1, only the HF gas, among the Hfac gas, the HCl gas and the HF gas, was supplied to the wafer W using the aforementioned etching device 1 to remove the natural oxide film 72. In evaluation test 1-2, a wet etching process was performed on the wafer W using a chemical solution that can remove $InO_X$. In evaluation tests 1-3, 1-4, and 1-5, only the Hfac gas, among the Hfac gas, the HCl gas and the HF gas, was supplied to the wafer W using the aforementioned etching device 1 to remove the natural oxide film 72. In evaluation tests 1-3 to 1-5, the supply time period of the Hfac gas was set to 5 minutes and the internal pressure of the process vessel 11 when supplying the Hfac gas was set at 50 Torr. However, in evaluation tests 1-3 to 1-5, the temperatures of the wafer W when supplying the Hfac gas were differently set. For example, the temperatures of the wafer W were set at 250 degrees C. in evaluation test 1-3, at 275 degrees C. in evaluation test 1-4, and at 300 degrees C. in evaluation test 1-5, respectively.

Figure 21:
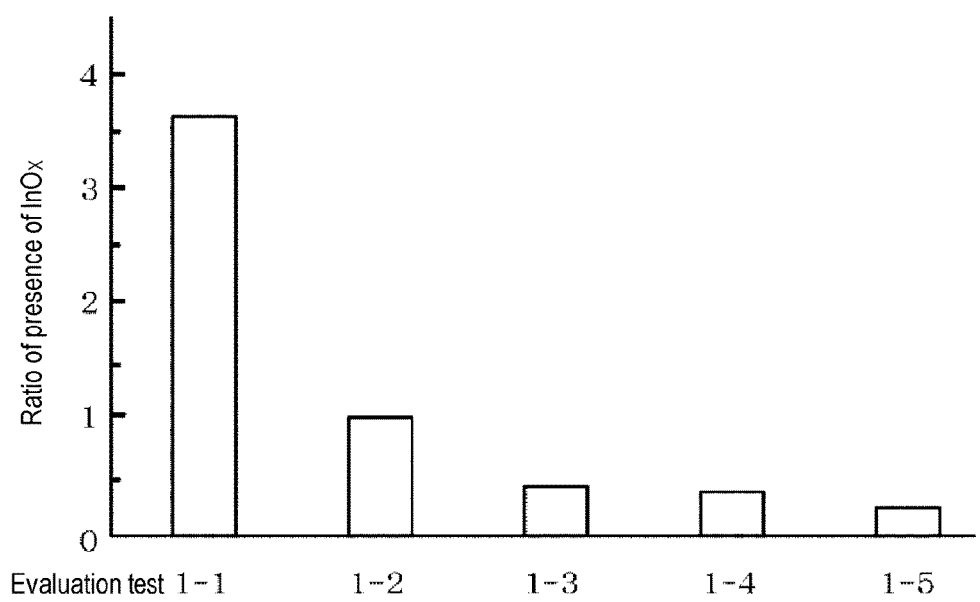
FIG. 21 is a graph illustrating the results of an evaluation test.
Figure 22:
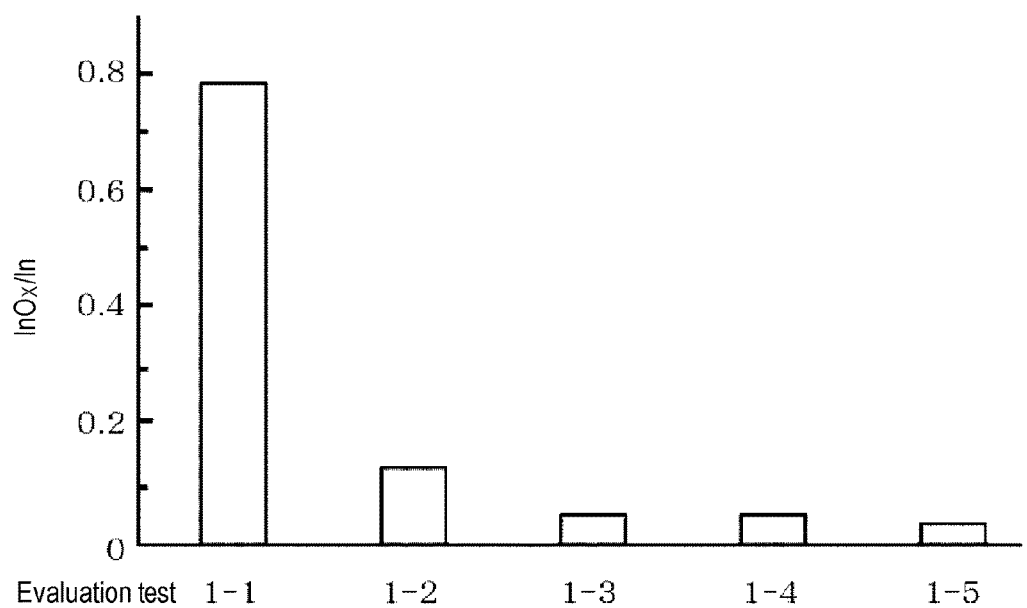
FIG. 22 is a graph illustrating the results of an evaluation test.

The surface of the InGaAs layer 71 of each wafer W processed as described above was measured by an X-ray photoelectron spectroscopy (XPS) to obtain a spectrum. FIGS. 16 to 20 illustrate positions showing the presence of indium and the presence of $InO_X$ in the obtained spectrum, in which numerical values on the horizontal axis represent a bond energy (unit: eV) of an element. The waveform of indium is indicated by the solid line and the waveform of $InO_X$ is indicated by the dotted line. It indicates that the larger the peak of the waveform is, the larger the amount detected for indium or $InO_X$ is. Graphs of FIGS. 21 and 22 were prepared from the obtained spectrum. The graph of FIG. 21 shows the ratio of the presence of $InO_X$ atoms on the surface of the InGaAs layer 71 for each evaluation test. Furthermore, the graph of FIG. 22 shows the ratio of the presence of $InO_X$X to indium (amount of $InO_X$/amount of indium) for each evaluation test.

Figure 16:
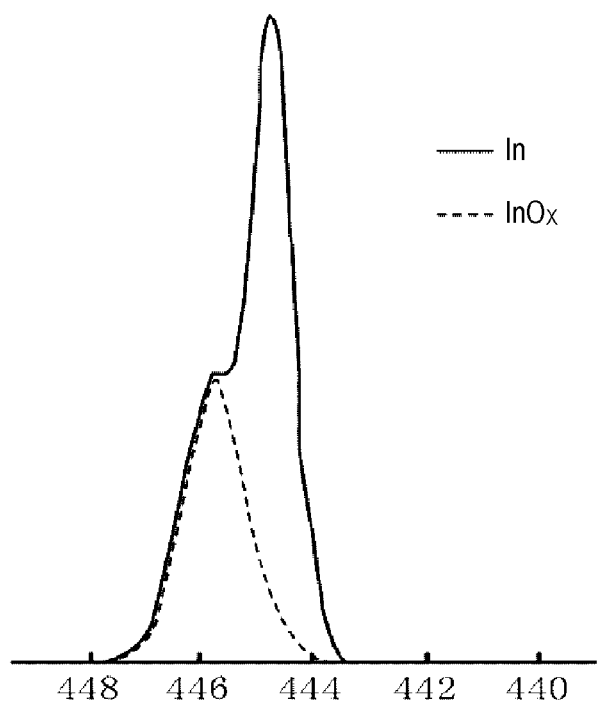
FIG. 16 is a graph illustrating the results of an evaluation test.
Figure 17:
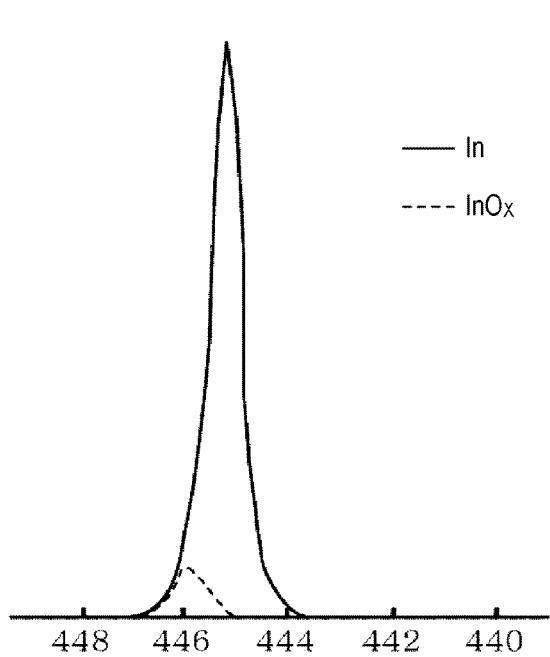
FIG. 17 is a graph illustrating the results of an evaluation test.

As shown in the spectrum of FIG. 16, in evaluation test 1-1, the peak of the waveform of $InO_X$ is relatively large. From this spectrum and the graphs of FIGS. 21 and 22, in evaluation test 1-1, it can be seen that a relatively large amount of $InO_X$ remains on the surface of the InGaAs layer 71. Furthermore, as shown in the spectrum of FIG. 22, in evaluation test 1-2, the peak of $InO_X$ is suppressed lower than that in evaluation test 1-1. From the graphs of FIGS. 21 and 22, it can also be seen that $InO_X$ is removed in evaluation test 1-2 compared with evaluation test 1-1. In practice, however, it is required to remove more $InO_X$.

Figure 18:
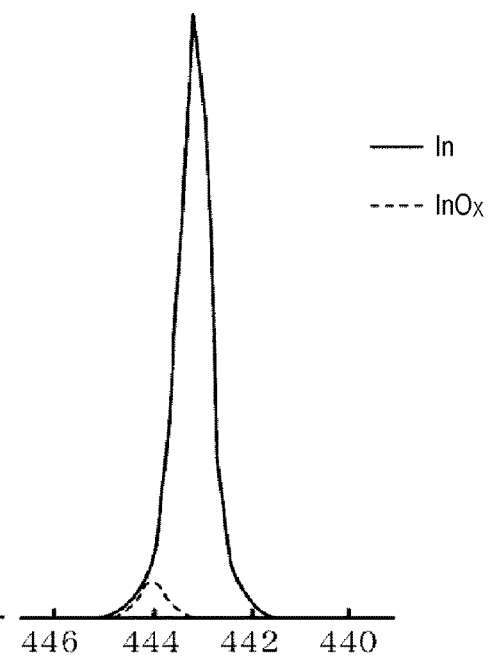
FIG. 18 is a graph illustrating the results of an evaluation test.
Figure 19:
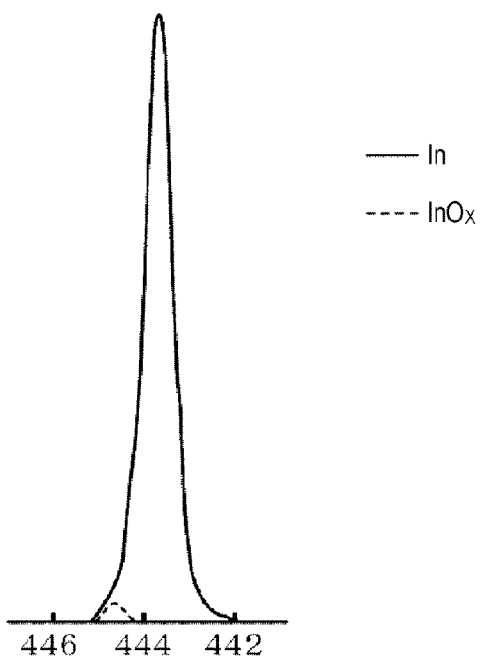
FIG. 19 is a graph illustrating the results of an evaluation test.
Figure 20:
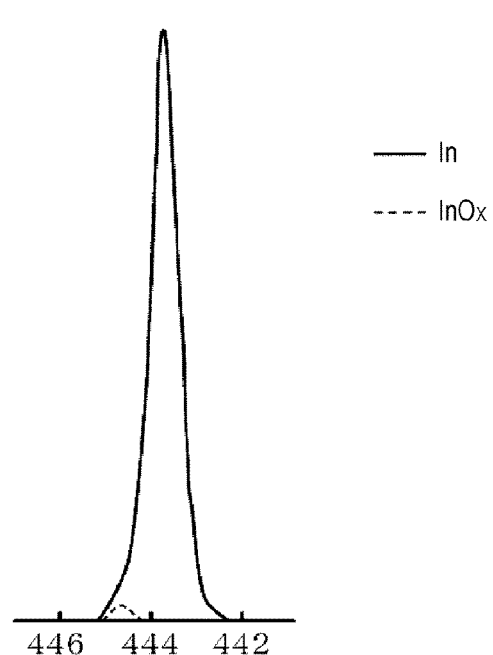
FIG. 20 is a graph illustrating the results of an evaluation test.

As shown in the spectra of FIGS. 18 to 20, in evaluation tests 1-3 to 1-5, the peak of the waveform of $InO_X$ is smaller than that in evaluation test 1-2. As can be seen from these spectra and the graphs of FIGS. 21 and 22, in evaluation tests 1-3 to 1-5, the amount of $InO_X$ present on the surface of the InGaAs layer 71 is extremely small. In addition, in evaluation tests 1-3 to 1-5, the wafer W is exposed to the air atmosphere until the wafer W is processed by the etching device 1 and then transferred to an inspection device that performs XPS. Thus, it is considered that $InO_X$ of the wafer W before being exposed to the air atmosphere is smaller than those shown in these spectra of FIGS. 18 to 20 and the graphs of FIGS. 21 and 22. In evaluation tests 1-3 to 1-5, it is presumed that $InO_X$ was completely or almost completely removed. As described above, it was confirmed in evaluation test 1 that $InO_X$ was removed by performing the process with the Hfac gas at a relatively low temperature of 250 to 300 degrees C.

What is claimed is:

1. A method of removing a natural oxide film formed on a surface of a semiconductor layer containing a compound of indium and an element other than indium as a main ingredient, comprising:
    supplying a first etching gas which is β-diketone to the semiconductor layer and heating the semiconductor layer to remove an oxide of the indium constituting the natural oxide film; and
    supplying a second etching gas to the semiconductor layer and heating the semiconductor layer to remove an oxide of the element other than indium constituting the natural oxide film.

2. The method of claim 1, wherein in the supplying a first etching gas, the semiconductor layer is heated at a temperature lower than a decomposition temperature of the first etching gas.

3. The method of claim 1, wherein the element other than indium contains one of gallium, arsenic, and antimony.

4. The method of claim 3, wherein the second etching gas contains one of a hydrogen chloride gas and a hydrogen fluoride gas.

5. The method of claim 1, wherein the element other than indium includes gallium and arsenic, and
    the second etching gas includes a hydrogen chloride gas and a hydrogen fluoride gas.

6. The method of claim 1, wherein the supplying a first etching gas and the supplying a second etching gas are performed at different timings.

7. The method of claim 1, wherein the β-diketone is hexafluoroacetylacetone.

8. A device for removing a natural oxide film formed on a surface of a semiconductor layer containing a compound of indium and an element other than indium as a main ingredient, the device comprising:
    a mounting part installed inside a process vessel and configured to mount the semiconductor layer thereon;
    a heating part configured to heat the semiconductor layer mounted on the mounting part;
    a first etching gas supply part configured to supply a first etching gas which is β-diketone to the semiconductor layer;
    a second etching gas supply part configured to supply a second etching gas to the semiconductor layer; and
    a controller programmed to:
        remove an oxide of the indium constituting the natural oxide film by supplying the first etching gas to the semiconductor layer using the first etching gas supply part and heating the semiconductor layer using the heating part; and
        remove an oxide of the element other than the indium constituting the natural oxide film by supplying the second etching gas to the semiconductor layer using the second etching gas supply part and heating the semiconductor layer using the heating part.

* * * * *